US009299608B2

(12) United States Patent
Wu et al.

(10) Patent No.: US 9,299,608 B2
(45) Date of Patent: Mar. 29, 2016

(54) T-SHAPED CONTACTS FOR SEMICONDUCTOR DEVICE

(71) Applicant: GLOBALFOUNDRIES Inc., Grand Cayman (KY)

(72) Inventors: Xusheng Wu, Ballston Lake, NY (US); Changyong Xiao, Mechanicville, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/281,454

(22) Filed: May 19, 2014

(65) Prior Publication Data

US 2015/0332963 A1 Nov. 19, 2015

(51) Int. Cl.
*H01L 21/28* (2006.01)
*H01L 21/768* (2006.01)

(52) U.S. Cl.
CPC .... *H01L 21/76879* (2013.01); *H01L 21/76804* (2013.01)

(58) Field of Classification Search
CPC ............... H01L 21/76802; H01L 21/7684; H01L 21/76877; H01L 21/76897; H01L 21/76801
USPC .......... 438/618, 622, 666, 671, 672
See application file for complete search history.

(56) References Cited

U.S. PATENT DOCUMENTS 6,566,718 B2 * 5/2003 Wieczorek ........ H01L 21/76802
257/368

* cited by examiner

*Primary Examiner* — Quoc Hoang
(74) *Attorney, Agent, or Firm* — Wayne F. Reinke, Esq.; Heslin Rothenberg Farley & Mesiti P.C.

(57) ABSTRACT

A transistor, planar or non-planar (e.g., FinFET), includes T-shaped contacts to the source, drain and gate. The top portion of the T-shaped contact is wider than the bottom portion, the bottom portion complying with design rule limits. A conductor-material filled trench through a multi-layer etching stack above the transistor provides the top portions of the T-shaped contacts. Tapered spacers along inner sidewalls of the top contact portion prior to filling allow for etching a narrower bottom trench down to the gate, and to the source/drain for silicidation prior to filling.

15 Claims, 5 Drawing Sheets

T-SHAPED CONTACTS FOR SEMICONDUCTOR DEVICE

BACKGROUND OF THE INVENTION

1. Technical Field

The present invention generally relates to contacts for semiconductor devices. More specifically, the present invention relates to T-shaped contacts for non-planar semiconductor devices.

2. Background Information

As overall semiconductor device size continues to shrink, so do the contact sizes. Typically, the contacts for non-planar devices are made by filling roughly V-shaped (in practice) openings to the relevant areas of the device with a conductive material. However, as the size of those openings shrink, the filling process can cause gaps in the center of the fill (otherwise known as "pinch-off"), which results in an increase in resistance and, in the worst case, an open connection.

Therefore, a need exists for improved contacts for non-planar semiconductor devices.

SUMMARY OF THE INVENTION

The shortcomings of the prior art are overcome and additional advantages are provided through the provision, in one aspect, of a method of fabricating T-shaped contacts for a semiconductor structure. The method includes providing a starting semiconductor structure, the structure including a semiconductor substrate, an active layer with one or more active regions, at least one gate over a portion of the active layer, and a layer of filler material on both sides of the at least one gate. The method further includes creating a multi-layer etching stack over the starting structure, the multi-layer etching stack including a dielectric layer between top and bottom hard mask layers, only the dielectric layer and bottom hard mask layers being used as etch stops. The method further includes creating T-shaped contacts thru the multi-layer etching stack to the one or more active regions and the at least one gate, each T-shaped contact using a single fill of bulk conductive material.

In accordance with another aspect, a semiconductor structure with T-shaped contact(s) is provided. The structure includes a semiconductor substrate, the semiconductor substrate including an active layer having one or more active regions with silicide thereon, and at least one gate over a portion of the active layer and having a gate cap and spacers and a layer of filler material on outer sides of the spacers. The semiconductor substrate further includes a multi-layer stack above the filler material and the gate cap of the at least one gate, and T-shaped contacts to the one or more active regions and the at least one gate. A top portion of the T-shaped contacts is wider than a bottom portion of the T-shaped contacts.

These, and other objects, features and advantages of this invention will become apparent from the following detailed description of the various aspects of the invention taken in conjunction with the accompanying drawings.

DETAILED DESCRIPTION OF THE INVENTION

Figure 1:
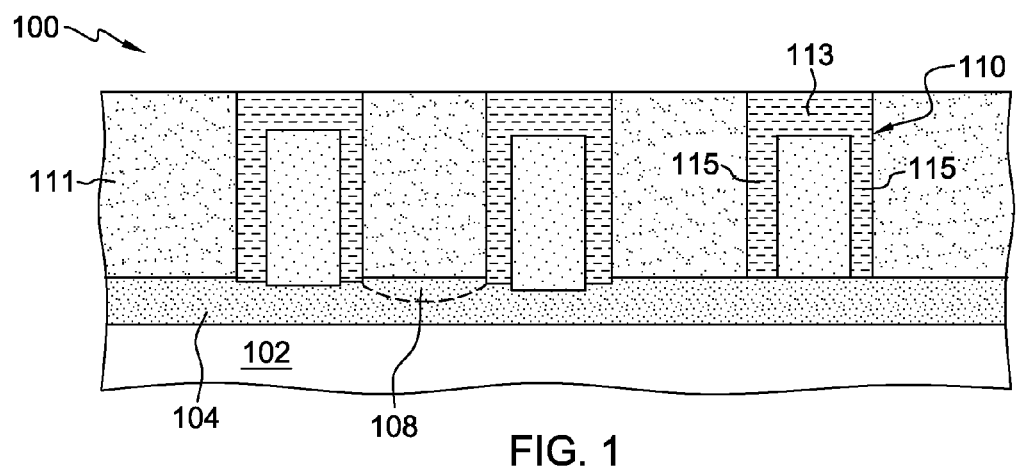
FIG. 1 is a cross-sectional view depicting one example of a starting semiconductor structure, in this example, a non-planar structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include"

(and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 depicts a cross-sectional view, taken at a raised structure (e.g., a "fin"), of one example of a starting semiconductor structure 100, in accordance with one or more aspects of the present invention. In this example, the structure is non-planar, but it will be understood that the present invention is also applicable to planar semiconductor structures. The non-planar structure may be, for example, a non-planar transistor, e.g., a FinFET, including a substrate 102.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The non-planar structure further includes at least one raised semiconductor structure 104 (raised with respect to the substrate). In one example, the raised structures may take the form of a "fin." The raised structure(s) may be etched from a bulk substrate, and may include, for example, any of the materials listed above with respect to the substrate. Further, some or all of the raised structure(s) may include added impurities (e.g., by doping), making them N type or P type.

Between adjacent raised structures, not shown due to the cross-section being at a raised structure, there would be some type of isolation material, which also serves the purpose of physically supporting the raised structures. For example, bulk silicon substrates may include Shallow Trench Isolation (STI) material, or, in the case of using silicon-on-insulator, the material may be Buried Oxide (BOX) material. In both cases, the isolation materials may include, for example, one or more oxides. The raised structure(s) include active regions, such as active region 108, and may be, for example, source and/or drain regions of a non-planar transistor. Portions of the raised structure(s), e.g., channel region(s) of a FinFET, are encompassed by gate structures, for example, gate structure 110. Between adjacent gate structures is a layer 111 of a filler material, for example, an oxide. In other specific examples, the filler material may be a flowable oxide, high density plasma oxide or a combination thereof. In the present example, the gate is metal and is surrounded by a gate cap 113 and spacers 115. The cap and spacers may be, for example, a nitride, a low-k nitride, a hybrid material (e.g., nitride/oxide/nitride), or a low-k hybrid material. As used herein, the term "low-k" refers to a dielectric constant value of less than 3.9.

Figure 2:
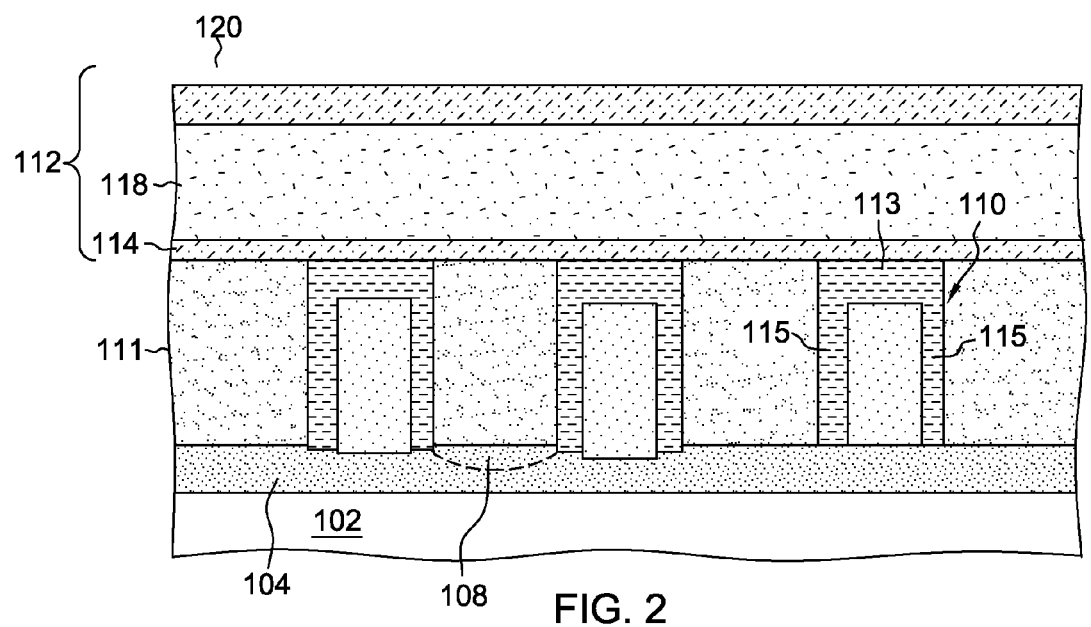
FIG. 2 depicts one example of the non-planar semiconductor structure of FIG. 1 after creation of dielectric and hard mask layers, in accordance with one or more aspects of the present invention.

FIG. 2 depicts one example of the non-planar semiconductor structure of FIG. 1 after creation of a multi-layer etching stack 112 for etching trenches to create the T-shaped contacts, in accordance with one or more aspects of the present invention. The T-shape of the contacts does not suffer pinching when being filled with a conductor, because the aspect ratio of the bottom portion of the T-shape (i.e., height divided by weight) is small enough.

Stack 112 includes a bottom hard mask layer 114 over the starting structure 100, a layer 118 of one or more dielectric materials over the bottom hard mask layer, and a top hard mask layer 120 over the top dielectric layer. The bottom hard mask layer is used as an etch stop, explained more fully below, and may be, for example, a nitride, e.g., silicon nitride. Other possible materials for the bottom hard mask include, for example, amorphous carbon, silicon carbide ($Si_xC_y$) and low-k SiCO:H (carbon doped oxide dielectric). In one example, the bottom hard mask layer may be deposited conventionally using, e.g., chemical vapor composition (CVD), and may have a thickness of, for example, about 5 nm to about 50 nm. The bottom dielectric layer may be, for example, an oxide or tetraethyl orthosilicate (TEOS), which may be conventionally deposited, for example, using CVD, and may have a thickness of, for example, about 5 nm to about 200 nm. The top hard mask layer may be, for example, a nitride, e.g., silicon nitride and may be conventionally deposited, for example, using CVD, and may have a thickness of, for example, about 5 nm to about 50 nm.

Figure 3:
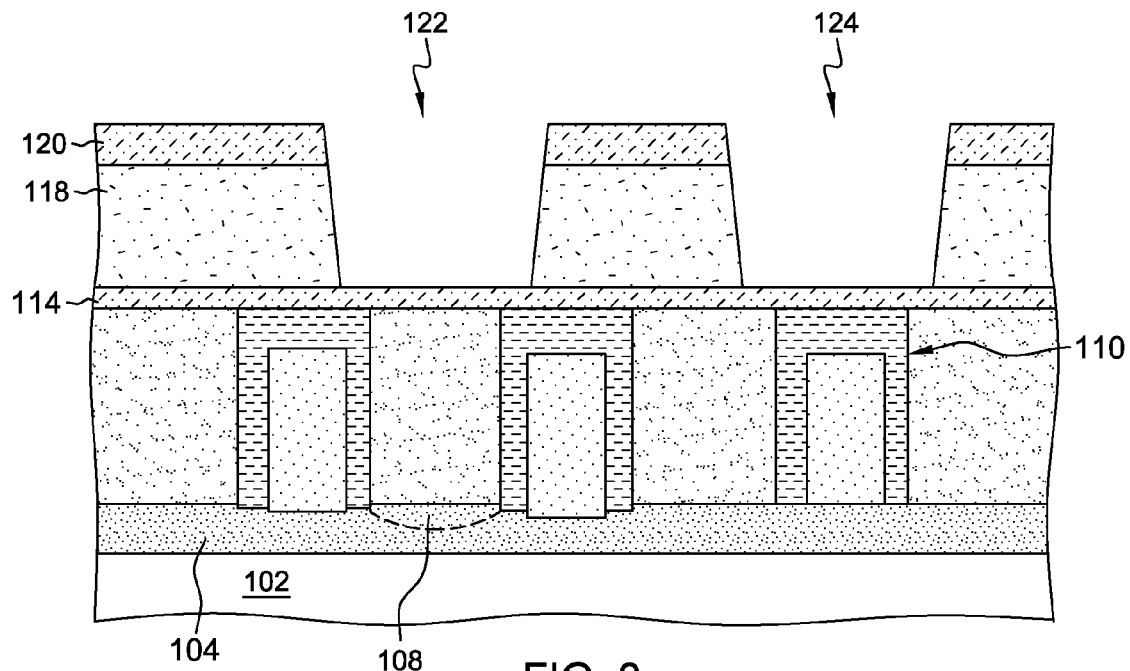
FIG. 3 depicts one example of the non-planar semiconductor structure of FIG. 2 after etching top trenches to the active region(s) and gate, stopping on the bottom hard mask layer, in accordance with one or more aspects of the present invention.

FIG. 3 depicts one example of the non-planar semiconductor structure of FIG. 2 after etching top trenches 122 and 124 to the active region(s) 108 and gate(s) 110, stopping on bottom hard mask layer 114, in accordance with one or more aspects of the present invention. Although shown in the figures as similarly sized for ease of viewing, it will be understood that they would typically be of different sizes. In one example, trenches to the active areas and the gates are performed separately in two steps. The first step is to etch through top hard mask layer 120 using an etch that performs well for the material of the first hard mask while not etching top dielectric layer 118. For example, if the top hard mask layer is silicon nitride and the top oxide layer is regular oxide, the etch may be performed using a dry etch, e.g., a reactive ion etch (RIE). The second step is to etch through the dielectric layer 118 using an etch that will stop on bottom hard mask layer 114. For example, where the dielectric layer is regular oxide, the etch may be performed using a dry etch, for example, RIE, with proper selectivity to neighboring layer materials.

Figure 4:
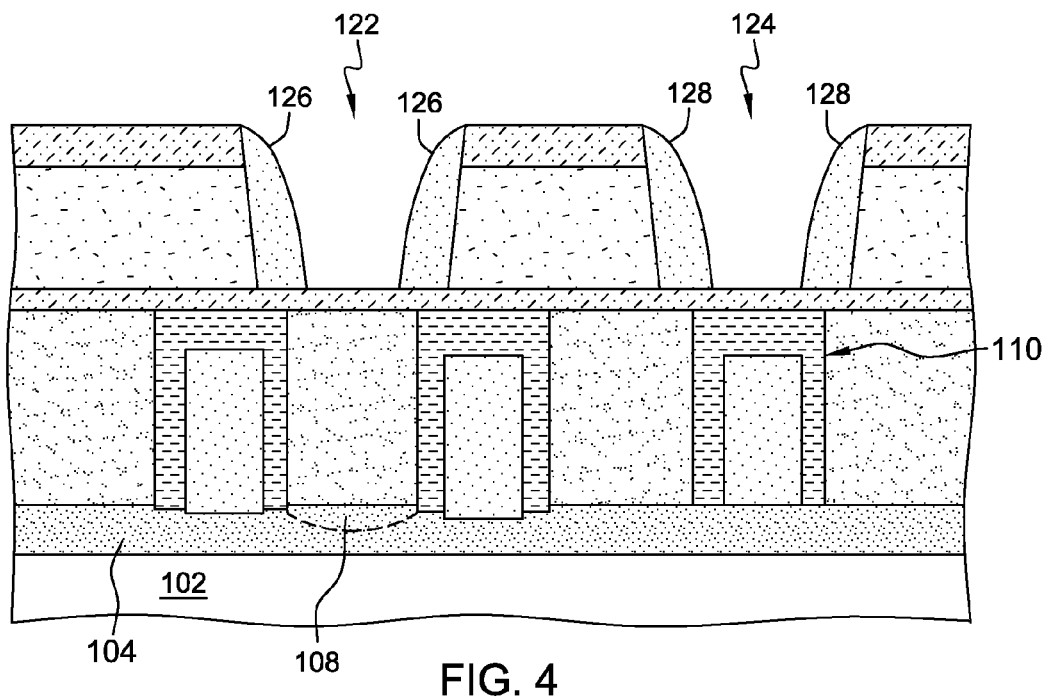
FIG. 4 depicts one example of the non-planar semiconductor structure of FIG. 3 after creation of tapered spacers in the top trenches for etching bottom trenches to the active region(s) and gate, in accordance with one or more aspects of the present invention.

FIG. 4 depicts one example of the non-planar semiconductor structure of FIG. 3 after creation of tapered spacers 126 and 128 in the top trenches 122 and 124, respectively, for etching bottom trenches to the active region(s) 108 and gate 110, in accordance with one or more aspects of the present invention. In one example, the spacers may be amorphous silicon, and creation may be accomplished by a blanket amorphous silicon deposition, followed by an etch. In one example, the blanket deposition may be accomplished using, for example, CVD or plasma-enhanced CVD to name but two, and the etch may be a dry etch, for example, RIE.

Figure 5:
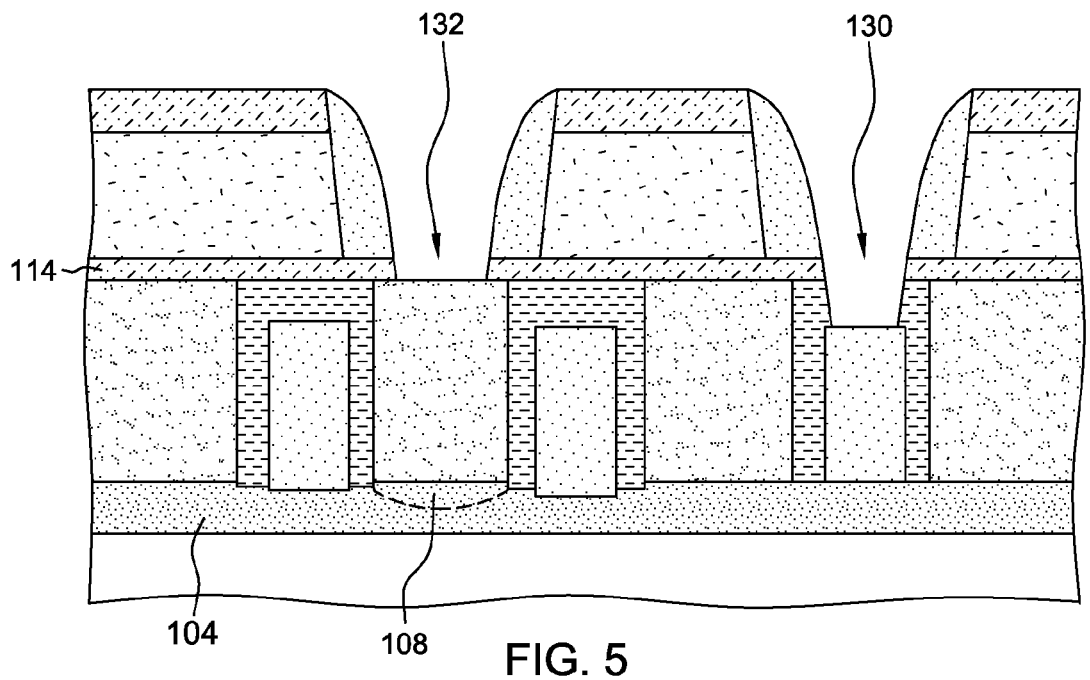
FIG. 5 depicts one example of the non-planar semiconductor structure of FIG. 4 after etching to create a bottom gate trench and beginning to etch a trench to the active region, in accordance with one or more aspects of the present invention.

FIG. 5 depicts one example of the non-planar semiconductor structure of FIG. 4 after etching to create a bottom gate trench 130 and beginning to etch a trench 132 to the active region(s) 108, in accordance with one or more aspects of the present invention. Etching to create the bottom gate trenches and beginning to create the bottom active area trench(es) may be accomplished using, for example, a single reactive ion etch, and stopping on filler layer 111 and gate 136. A reactive ion etch process will remove both the relevant portions of hard mask layer 114 and gate cap 113 (see FIG. 1).

Figure 6:
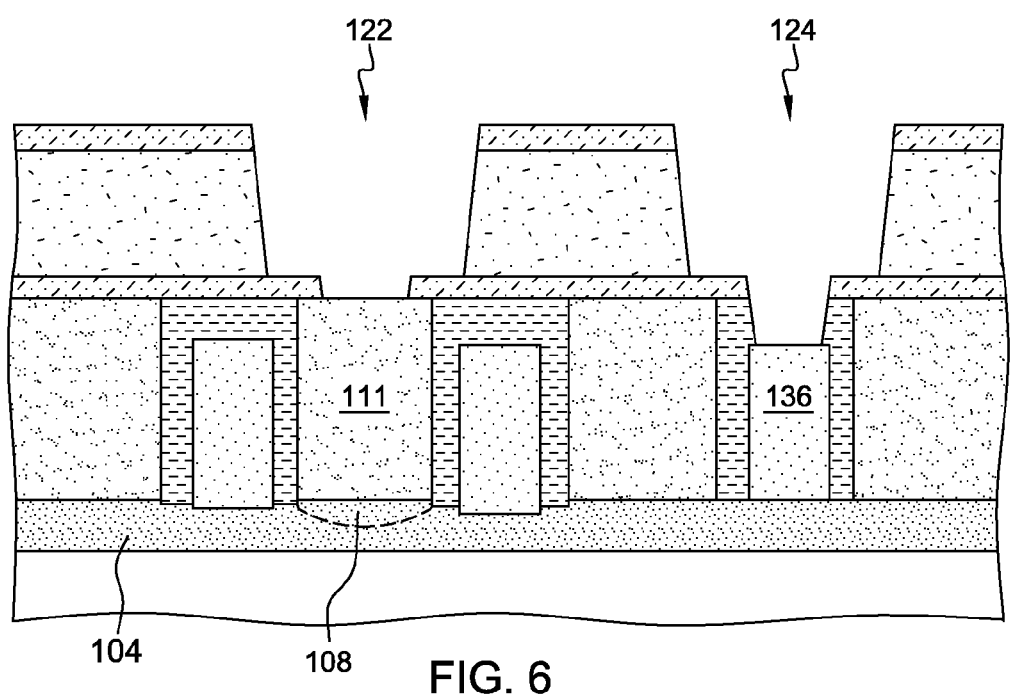
FIG. 6 depicts one example of the non-planar semiconductor structure of FIG. 5 after removing the spacers from the top trenches, in accordance with one or more aspects of the present invention.

FIG. 6 depicts one example of the non-planar semiconductor structure of FIG. 5 after removing the spacers (130, 132, FIG. 5) from the top trenches 122 and 124, in accordance with one or more aspects of the present invention. In one example, the spacers may be removed using a wet etch, for example, an ammonia or tetramethyl ammonium hydroxide (TMAH) based solution for silicon. Alternatively, a hybrid etch with a combination of dry etch and wet etch may be used.

Figure 7:
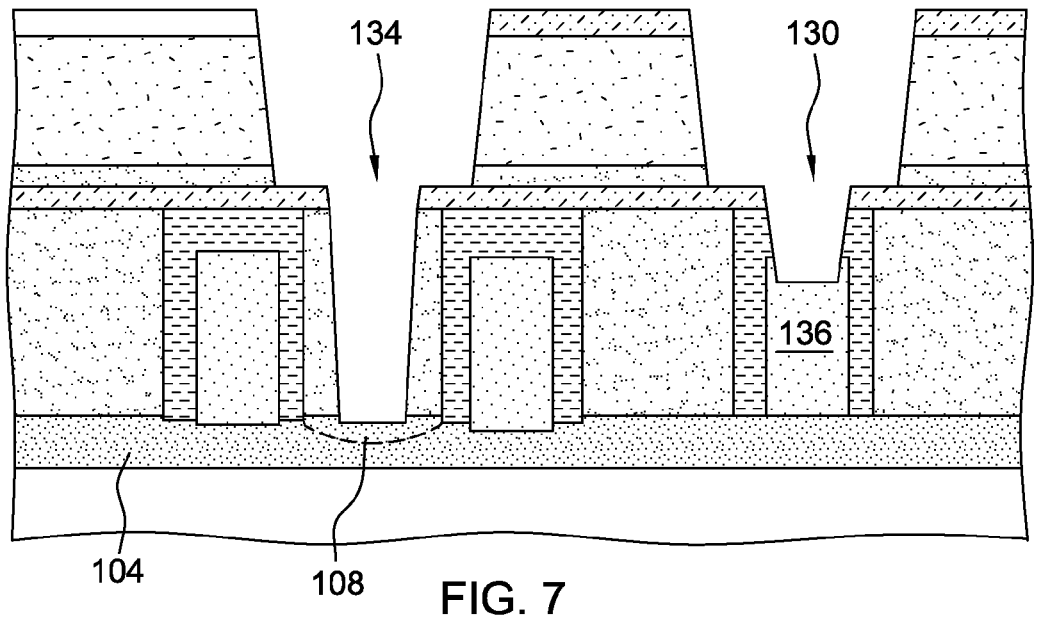
FIG. 7 depicts one example of the non-planar semiconductor structure of FIG. 6 after creating the bottom trench for the active region and extending the gate bottom trench into the gate, in accordance with one or more aspects of the present invention.

FIG. 7 depicts one example of the non-planar semiconductor structure of FIG. 6 after completing the bottom trench 134 for the active region(s) 108 and extending the gate bottom trench 130 into the gate 136, in accordance with one or more aspects of the present invention. Both may be accomplished using, for example, a second reactive ion etch similar to that used with respect to FIG. 6.

Figure 8:
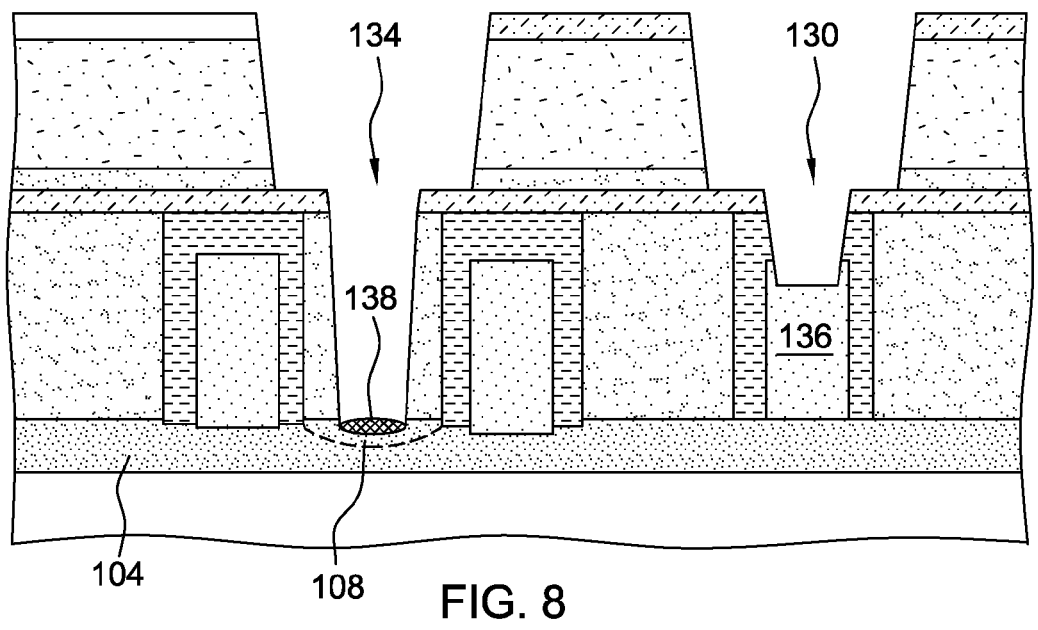
FIG. 8 depicts one example of the non-planar semiconductor structure of FIG. 7 after silicidation of the active region(s), in accordance with one or more aspects of the present invention.

FIG. 8 depicts one example of the non-planar semiconductor structure of FIG. 7 after silicidation 138 of the active region(s), in accordance with one or more aspects of the present invention. Silicide 138 may be formed from a refractory metal, such as, for example, cobalt, nickel, titanium, tantalum, platinum, palladium, rhodium and mixtures thereof that have been chemically reacted with silicon, e.g., the silicon of active region(s) 108, exposed from within bottom trench 134. In a specific example, nickel or a nickel-containing alloy may be deposited within the bottom trench to allow contact with the silicon surface of the underlying active region and annealed at a temperature of about 450° C., for a time period sufficient to cause the nickel alloy layer to react with the underlying silicon, to form nickel silicide or a nickel alloy silicide using, for example, a rapid thermal anneal (RTP) process. As one skilled in the art will understand, unreacted nickel or nickel-containing alloy may be removed from the bottom trench (and top trench, if present) by performing a selective etching process. This etching process is highly selective to remove the unreacted metal while not attacking the reacted silicide areas.

One skilled in the art will know that tungsten has poor adhesion to the underlying layers. Although not shown for simplicity, the top and bottom trenches may be lined with a contact liner, including a barrier/adhesive layer, and a gettering layer protecting the silicide may also be present. The gettering layer ensures that oxygen, formed due to exposure of underlying silicide to ambient conditions, remaining after various post pre-clean conditions (e.g., argon (Ar) sputter, SiCoNi dry etch conditions), is gettered of the underlying silicide layer on the active region(s) 108 and also to decrease contact resistance.

Figure 9:
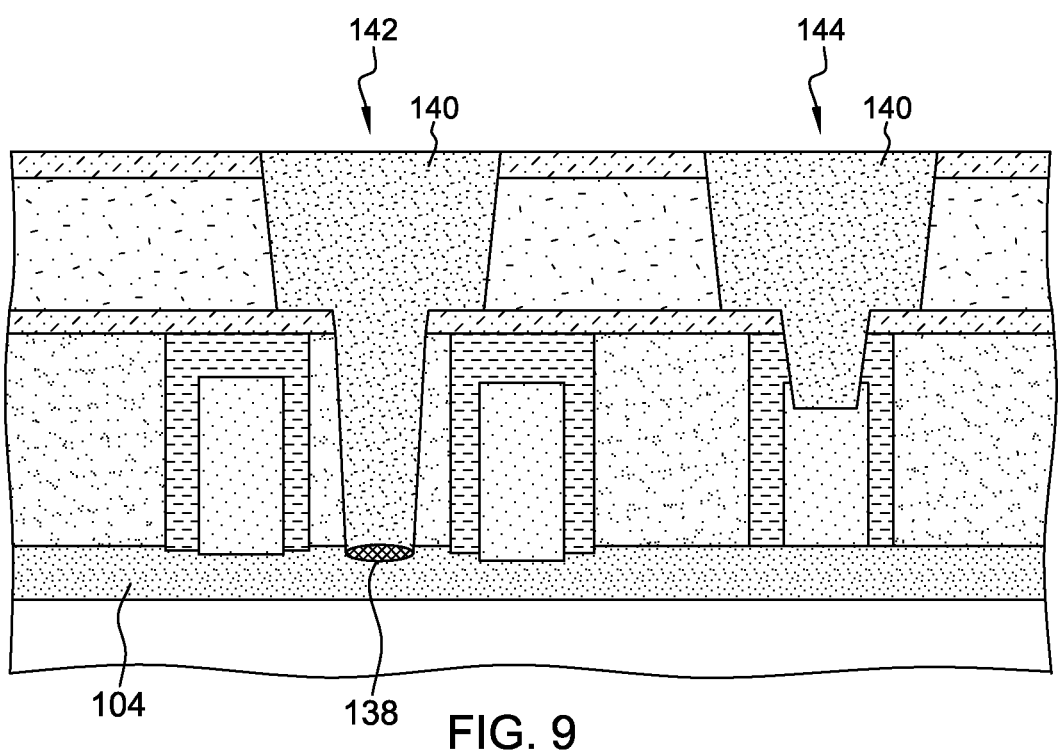
FIG. 9 depicts one example of the non-planar semiconductor structure of FIG. 8 after filling of the top and bottom trenches with a conductive material, in accordance with one or more aspects of the present invention.

FIG. 9 depicts one example of the non-planar semiconductor structure of FIG. 8 after filing of the top and bottom trenches with a conductive material 140, in accordance with one or more aspects of the present invention. In one example, where the contact material is tungsten, a tungsten nucleation layer (not shown) may be deposited to facilitate the subsequent formation of bulk tungsten material, using conventional deposition processes such as, for example, chemical vapor deposition (CVD), atomic layer deposition (ALD) and pulsed nucleation layer deposition (PNL) deposition processes. The thickness of the nucleation layer may be about 2 nm to about 3 nm and may be deposited by, for example, performing alternating pulsing sequences of boron-containing reducing agent and tungsten-containing precursor in presence of a reducing agent. The boron-containing reducing agents include, but are not limited to, borane ($BH_3$), diborane ($B_2H_6$), triborane, boron halides such as, for example, boron trifluoride ($BF_3$), boron trichloride ($BCl_3$) and the like. The tungsten-containing precursors may include tungsten-containing gases such as, for example, $WF_6$, $WCl_6$ and $W(CO)_6$ and the like, while the reducing agents may include hydrogen gas ($H_2$), silane ($SiH_4$), disilane ($Si_2H_6$), hydrazine ($N_2H_4$) and germane ($GeH_4$). The bulk material of tungsten 140 may be deposited over the nucleation layer via, for example, a two step chemical vapor deposition process.

One example of the bulk deposition process involves a chemical vapor deposition (CVD) reaction of tungsten-containing precursor, such as tungsten hexafluoride ($WF_6$), and reducing gases, such as hydrogen ($H_2$) to produce tungsten and a by-product, such as for example, hydrogen hexafluoride (HF) at temperature of about 250° C. to about 400° C. Optionally, the stress induced by the tungsten formed may be manipulated using various nucleation/adhesive layers such as, for example tungsten-based nucleation layers (e.g., WN, WC, WCN, WSiN).

In one aspect, disclosed above is a method of fabricating T-shaped contacts for a semiconductor structure. The method includes providing a starting non-planar semiconductor structure, the structure including a semiconductor substrate, an active layer with one or more active regions, at least one gate over a portion of the active layer, and a layer of filler material on both sides of the gate(s). The method further includes creating a multi-layer etching stack over the starting structure, and creating T-shaped contacts thru the multi-layer etching stack to the active region(s) and the gate(s).

In one example, creating the T-shaped contacts may include creating T-shaped trenches to the active region(s) and the gate(s), creating silicide on the raised structure(s), and filling the T-shaped trenches with at least one conductive material. Creating the T-shaped trenches may include, for example, creating top portions of the T-shaped trenches, and creating bottom portions of the T-shaped trenches, the top portions being wider than the bottom portions.

In one example, creating the multi-layer etching stack may include creating a bottom hard mask layer over the starting structure, creating a layer of one or more dielectric materials over the bottom hard mask layer, and creating a top hard mask layer over the dielectric layer. Where the multi-layer etching stack is present, creating the top portions of the T-shaped trenches may include, for example, etching the top hard mask layer and stopping on the dielectric layer, and etching the top and bottom dielectric layers and stopping on the bottom hard mask layer.

In one example, surrounding the gate(s) is a gate cap and spacers, and creating the bottom potions of the T-shaped trenches may include creating tapered spacers along the inner sidewalls of the top portions of the T-shaped trenches, etching through the bottom hard mask layer, removing the tapered spacers, etching through the layer of filler material to the active region(s) prior to creating the silicide, and etching through the gate cap to the gate.

Where multiple gates are present, in one example, a width of the top portions of the T-shaped trenches for the active region(s) may have a width of about half to about two-thirds of a gate pitch for the gates. In another example including at least two gates, a width of the top portions of the T-shaped trenches for the gates may have a width of about half to about three-fourths of a gate pitch for the gates. As used herein, "gate pitch" refers to the ordinary usage of the term, i.e., the distance from gate center to adjacent gate center.

In another example, the starting structure may include a starting non-planar semiconductor structure, the non-planar structure further including at least one raised semiconductor structure coupled to substrate with an isolation material on both sides thereof. The active layer is situated at a top portion of the raised structure(s), and the gate(s) surround the portion of the active layer. Creating the T-shaped contacts may include creating T-shaped trenches to the active region(s) and the gate(s), creating silicide on the raised structure(s), and filling the T-shaped trenches with at least one conductive material. Creating the T-shaped trenches may include creating top portions of the T-shaped trenches and creating bottom portions of the T-shaped trenches. The top portions are wider than the bottom portions. Creating the multi-layer etching stack may include creating a bottom hard mask layer over the starting structure, creating a layer of one or more dielectric materials over the bottom hard mask layer, and creating a top hard mask layer over the dielectric layer. Creating the top portions of the T-shaped trenches may include etching the top hard mask layer and stopping on the dielectric layer, and then etching the top and bottom dielectric layers and stopping on the bottom hard mask layer. Surrounding each gate may be a gate cap and spacers, and creating the bottom potions of the T-shaped trenches may include creating tapered spacers along inner sidewalls of the top portions of the T-shaped trenches, etching through the bottom hard mask layer, removing the tapered spacers, etching through the layer of filler material to the active region(s) prior to creating the silicide, and etching through the gate cap to the gate.

In another example, the gate(s) include at least two gates, and a width of the top portions of the T-shaped trenches for the active region(s) may have a width of from about half to about two-thirds of a gate pitch for the gates.

In another example, the gate(s) include at least two gates, and a width of the top portions of the T-shaped trenches for the gates may have a width of from about half to about three-fourths of a gate pitch for the gates.

In another aspect, the present invention includes a semiconductor structure with T-shaped contacts. The structure includes a semiconductor substrate, including an active layer having one or more active regions with silicide thereon, at least one gate over a portion of the active layer and having a gate cap and spacers and a layer of filler material on outer sides of the spacers. The structure further includes a multi-layer stack above the gate cap(s) and filler material, and T-shaped contacts to the active region(s) and the gate(s), a top portion of the T-shaped contacts being wider than a bottom portion of the T-shaped contacts.

In one example, with multiple gates, a width of the top portion of the T-shaped contacts for the active region(s) may be about half to about two-thirds of a gate pitch for the gates. In another example including at least two gates, a width of the top portion of the T-shaped contacts for the gates may be about half to about three-fourths of a gate pitch for the gates.

It should be noted that although applications with a relatively large distance between adjacent gates can benefit from the present invention, applications having a relatively smaller distance between the gates (e.g., below about 100 nm) will see the most benefit.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing a starting semiconductor structure, the structure comprising a semiconductor substrate, an active layer with one or more active regions, at least one gate over a portion of the active layer, and a layer of filler material on both sides of the at least one gate;
creating a multi-layer etching stack over the starting structure, the multi-layer etching stack comprising a dielectric layer between top and bottom hard mask layers, wherein only the dielectric layer and bottom hard mask layers are used as etch stops; and
creating T-shaped contacts thru the multi-layer etching stack to the one or more active regions and the at least one gate, wherein each T-shaped contact uses a single fill of bulk conductive material.

2. The method of claim 1, wherein creating the T-shaped contacts comprises:
creating T-shaped trenches to the one or more active regions and the at least one gate;
creating silicide on the at least one raised structure; and
filling the T-shaped trenches with at least one conductive material.

3. The method of claim 2, wherein creating the T-shaped trenches comprises:
creating top portions of the T-shaped trenches; and
creating bottom portions of the T-shaped trenches, wherein the top portions are wider than the bottom portions.

4. The method of claim 3, wherein the at least one gate comprises at least two gates, and wherein a width of the top portions of the T-shaped trenches for the one or more active regions have a width of from about half to about two-thirds of a gate pitch for the at least two gates.

5. The method of claim 3, wherein the at least one gate comprises at least two gates, and wherein a width of the top portions of the T-shaped trenches for the at least two gates have a width of from about half to about three-fourths of a gate pitch for the at least two gates.

6. The method of claim 1, wherein creating top portions of the T-shaped trenches comprises:
etching the top hard mask layer and stopping on the dielectric layer; and
etching the top and bottom dielectric layers and stopping on the bottom hard mask layer.

7. The method of claim 6, wherein surrounding the at least one gate is a gate cap and spacers, and wherein creating the bottom potions of the T-shaped trenches comprises:
creating tapered spacers along inner sidewalls of the top portions of the T-shaped trenches;
etching through the bottom hard mask layer;
removing the tapered spacers;

etching through the layer of filler material to the one or more active regions prior to creating the silicide; and etching through the gate cap to the gate.

8. The method of claim 1, wherein the starting structure comprises a starting non-planar semiconductor structure, the non-planar structure further comprising at least one raised semiconductor structure coupled to substrate with an isolation material on both sides thereof, wherein the active layer is situated at a top portion of the at least one raised structure, and wherein the at least one gate surrounds the portion of the active layer.

9. The method of claim 8, wherein creating the T-shaped contacts comprises:

creating T-shaped trenches to the one or more active regions and the at least one gate;

creating silicide on the at least one raised structure; and filling the T-shaped trenches with at least one conductive material.

10. The method of claim 9, wherein creating the T-shaped trenches comprises:

creating top portions of the T-shaped trenches; and creating bottom portions of the T-shaped trenches, wherein the top portions are wider than the bottom portions.

11. The method of claim 10, wherein creating the multi-layer etching stack comprises:

creating a bottom hard mask layer over the starting structure;

creating a layer of one or more dielectric materials over the bottom hard mask layer; and creating a top hard mask layer over the dielectric layer.

12. The method of claim 11, wherein creating the top portions of the T-shaped trenches comprises:

etching the top hard mask layer and stopping on the dielectric layer; and etching the top and bottom dielectric layers and stopping on the bottom hard mask layer.

13. The method of claim 12, wherein surrounding the at least one gate is a gate cap and spacers, and wherein creating the bottom potions of the T-shaped trenches comprises:

creating tapered spacers along inner sidewalls of the top portions of the T-shaped trenches;

etching through the bottom hard mask layer;

removing the tapered spacers;

etching through the layer of filler material to the one or more active regions prior to creating the silicide; and etching through the gate cap to the gate.

14. The method of claim 10, wherein the at least one gate comprises at least two gates, and wherein a width of the top portions of the T-shaped trenches for the one or more active regions have a width of from about half to about two-thirds of a gate pitch for the at least two gates.

15. The method of claim 10, wherein the at least one gate comprises at least two gates, and wherein a width of the top portions of the T-shaped trenches for the at least two gates have a width of from about half to about three-fourths of a gate pitch for the at least two gates.

* * * * *